US011860246B1

(12) United States Patent
Pan et al.

(10) Patent No.: US 11,860,246 B1
(45) Date of Patent: Jan. 2, 2024

(54) SHORT-RANGE POSITION TRACKING USING STATIONARY MAGNETIC FIELD GRADIENT

(71) Applicant: Apple Inc., Cupertino, CA (US)

(72) Inventors: Hong Pan, Fremont, CA (US); Jian Guo, Milpitas, CA (US); John G. Elias, Townsend, DE (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 735 days.

(21) Appl. No.: 16/782,012

(22) Filed: Feb. 4, 2020

Related U.S. Application Data

(63) Continuation of application No. 16/422,914, filed on May 24, 2019, now abandoned.

(51) Int. Cl.
*G06F 3/01* (2006.01)
*G01R 33/028* (2006.01)
(Continued)

(52) U.S. Cl.
CPC ........... *G01R 33/028* (2013.01); *G01C 19/56* (2013.01); *G01R 33/0094* (2013.01);
(Continued)

(58) Field of Classification Search
CPC .... G02B 2027/0132; G02B 2027/0134; G02B 2027/0178; G02B 2027/0187;
(Continued)

(56) References Cited

U.S. PATENT DOCUMENTS

| 2006/0197832 A1* | 9/2006 | Yamada | G02B 27/017 |
| | | | 348/E5.145 |
| 2017/0185160 A1 | 6/2017 | Cho et al. | |
| 2018/0010925 A1 | 1/2018 | Hobson-Dupont | |
| 2018/0095550 A1 | 4/2018 | Shilo | |
| 2019/0286232 A1* | 9/2019 | De Nardi | G06F 1/163 |
| 2020/0192094 A1* | 6/2020 | Miller | G01S 13/42 |

OTHER PUBLICATIONS

Chen et al., "Finexus: Tracking precise motions of multiple fingertips using magnetic sensing." Proceedings of the 2016 CHI Conference on Human Factors in Computing Systems, May 7, 2016, pp. 1504-1514.
(Continued)

*Primary Examiner* — Ram A Mistry
(74) *Attorney, Agent, or Firm* — Fish & Richardson P.C.

(57) ABSTRACT

Systems, methods, apparatuses and non-transitory, computer-readable mediums are disclosed for short-range position tracking using a stationary magnetic field gradient. In an embodiment, a method comprises: obtaining, by a sensing array of a device worn or held by a user in an environment, a measurement of a stationary magnetic field generated by a magnetic source in the environment, the stationary magnetic field being independent of an ambient magnetic field in the environment; determining based on the measurement, a change in the magnetic field over time; determining based on the measurement, a change in the magnetic field over distance; obtaining, by the processor, a rotation angle of the device; determining a velocity of the device based on the change in the magnetic field over time, the change in the magnetic field over distance and the rotation angle of the device; and integrating the velocity to obtain a position of the device.

17 Claims, 6 Drawing Sheets

(51) Int. Cl.
　　　*G06F 3/0346*　　(2013.01)
　　　*G01C 19/56*　　(2012.01)
　　　*G02B 27/01*　　(2006.01)
　　　*G01R 33/00*　　(2006.01)

(52) U.S. Cl.
　　　CPC .......... *G02B 27/0101* (2013.01); *G06F 3/012* (2013.01); *G06F 3/0346* (2013.01); *G02B 2027/0138* (2013.01)

(58) Field of Classification Search
　　　CPC .......... G02B 2027/0198; G02B 27/017; G02B 27/0172; G02B 30/34; G06F 3/012; G06F 3/147; G09G 3/002; G09G 3/003; G09G 5/399; H04N 13/117; H04N 13/167; H04N 13/189; H04N 13/279; H04N 13/289; H04N 13/344; H04N 13/373; H04N 13/376; H04N 13/378; H04N 13/38; H04N 13/398
　　　See application file for complete search history.

(56) References Cited

OTHER PUBLICATIONS

Fan et al., "Tracking of moving magnetic target based on magnetic gradient system with total field magnetometers." Sensor Review, Sep. 17, 2018, 38(4):501-8.

Gao et al., "Localization of Ferromagnetic Target with Three Magnetic Sensors in the Movement Considering Angular Rotation." Sensors, Sep. 2017, 17(9):2079. 14 pages.

Meina et al., "Position tracking using inertial and magnetic sensing aided by permanent magnet." 2016 Federated Conference on Computer Science and Information Systems (FedCSIS), Sep. 11, 2016, 8:105-111.

Vissière et al., "Using distributed magnetometers to increase IMU-based velocity estimation into perturbed area," 2007 46th IEEE Conference on Decision and Control, Dec. 12, 2007, pp. 4924-4931.

\* cited by examiner

Gradient ~ 1~1000 μT/cm

SHORT-RANGE POSITION TRACKING USING STATIONARY MAGNETIC FIELD GRADIENT

CROSS-REFERENCE TO RELATED APPLICATION

This application is a continuation of and claims priority to U.S. patent application Ser. No. 16/422,914, filed May 24, 2019, the entire contents of which are incorporated herein.

TECHNICAL FIELD

This disclosure relates to position tracking using magnetic field gradients.

BACKGROUND

A magnetic field that varies with location is called a magnetic field gradient. Research has shown that a location of a person can be tracked in an indoor environment using an ambient magnetic field gradient caused by Earth's magnetic field. The ambient magnetic field gradient, however, is often non-uniform and too weak for precise position tracking of multiple remote bodies over short distances.

SUMMARY

Systems, methods, apparatuses and non-transitory, computer-readable storage mediums are disclosed for short-range position tracking using a magnetic field gradient.

In an embodiment, a method comprises: obtaining, by a sensing array of a device worn or held by a user in an environment, a measurement of a stationary magnetic field generated by a magnetic source in the environment, the stationary magnetic field being independent of an ambient magnetic field in the environment; determining, by a processor of the device, a change in the magnetic field over time based on the measurement; determining, by the processor, a change in the magnetic field over distance based on the measurement; obtaining, by the processor, a rotation angle of the device; determining, by the processor, a velocity of the device based on the change in the magnetic field over time, the change in the magnetic field over distance and the rotation angle of the device; and integrating, by the processor, the velocity to obtain a position of the device.

In an embodiment, an apparatus comprises: a sensing array; a motion sensor; one or more processors; memory coupled to the one or more processors and storing instructions that when executed by the one or more processors, cause the one or more processors to perform operations comprising: obtaining, by the sensing array, a measurement of a stationary magnetic field in an environment, the stationary magnetic field generated by a magnetic source in the environment and being independent of an ambient magnetic field in the environment; determining a change in the magnetic field over time based on the measurement; determining a change in the magnetic field over distance based on the measurement; obtaining from the motion sensor a rotation angle of the apparatus; determining a velocity of the apparatus based on the change in the magnetic field over time, the change in the magnetic field over distance and the rotation angle of the apparatus; and integrating the velocity to obtain a position of the apparatus.

In an embodiment, a position tracking system, comprises: a magnetic source; a camera or ultrasonic sensor; a device configured to be work or held by a user, the device including: a sensing array; a motion sensor; one or more processors; memory coupled to the one or more processors and storing instructions that when executed by the one or more processors, cause the one or more processors to perform operations comprising: determining a first position of the device in an environment using data output from the camera or ultrasonic sensor; obtaining, by the sensing array, a measurement of a stationary magnetic field in the environment generated by the magnetic source in the environment, the stationary magnetic field being independent of an ambient magnetic field in the environment; determining a change in the magnetic field over time based on the measurement; determining a change in the magnetic field over distance based on the measurement; obtaining from the motion sensor a rotation angle of the device; determining a velocity of the device based on the change in the magnetic field over time, the change in the magnetic field over distance and the rotation Particular implementations disclosed herein provide one or more of the following advantages. The disclosed embodiments use a stationary magnetic field gradient in an environment generated by a magnetic source (e.g., a permanent magnet, electromagnet) placed in the environment and/or on a user's body to track the position of a remote body in the environment. The magnetic source is configured to generate a magnetic field gradient in the environment that is sufficiently strong to allow precise short-range position tracking of the remote body in the environment. The position tracking is independent of the local ambient magnetic field gradient, which is advantageous in outdoor environments where the ambient magnetic field gradient is low. The disclosed embodiments also allow for simultaneous tracking of multiple remote bodies within a certain distance of the magnetic source. The position of a body is calculated by integrating its velocity rather than performing a double integration of acceleration, which is more sensitive to drift. Applications such as augmented reality (AR) and virtual reality (VR) can benefit from the precise short-range position tracking (e.g., tracking hand positions) disclosed herein.

Other embodiments are directed to systems, method, apparatuses and non-transitory, computer-readable mediums.

The details of the disclosed implementations are set forth in the accompanying drawings and the description below. Other features, objects and advantages are apparent from the description, drawings and claims.

DETAILED DESCRIPTION

The disclosed short-range position tracking embodiments use a magnetic source (e.g., a permanent magnet, electromagnet) to generate a stationary magnetic field gradient in an environment that is independent of the local ambient magnetic field gradient of the environment. In an embodiment, an alternating current (AC) field is the magnetic source. In an embodiment, a user wears or holds a device (e.g., smartwatch, smart pencil) that includes a sensing array (e.g., array of magnetometers), an angular rate sensor (e.g., a 3-axis MEMS gyro) and a processor. The processor obtains measurements of the stationary magnetic field gradient from the sensing array and stores the measurements in memory of the device. The processor also obtains the rotation angle of the device from a motion sensor. The processor computes the velocity of the device based on current and stored magnetic field gradient measurements and the rotation angle. The processor integrates the velocity to obtain the position of device.

Applications such as AR and VR use short-range position tracking (e.g., tracking hand positions) to precisely track the hands of a user while the user interacts with the AR/VR application. The user's hands move through the stationary magnetic field gradient enabling the sensing array to measure the change of the magnetic field gradient as the hands move. The changing magnetic field gradient is used to compute the velocity of the hands, which is integrated by the processor to obtain position. In an embodiment, the magnetic source is mounted on either the head or the chest of the user. In the case where the magnetic source is mounted on the head, the rotation and translation of the head with respect to the hands is removed to provide a stationary magnetic field gradient with respect to the hands.

In an embodiment, drift in the position measurement due to the integration of velocity is corrected with data from another sensor (e.g., a video camera, a ultrasonic distance sensor, etc.). In an embodiment, to mitigate drift the velocity is set to zero whenever motion data (e.g., acceleration data) measured by a motion sensor (e.g., an accelerometer) indicates the hand velocity should be zero. In an embodiment, interfering magnetic sources are cancelled out by the sensing array. In an embodiment, sensing arrays with different spatial arrangements are used to provide robust gradient measurements.

In an embodiment, the initial position of device with the sensing array is established by the user by placing their hands in a known reset position (e.g., over the ears). The initial position can also be determined from data obtained by another sensor (e.g., a camera, ultrasonic distance sensor). In an embodiment, the user may have multiple reset positions, where the position is reset automatically to the known reset location.

Figure 1:
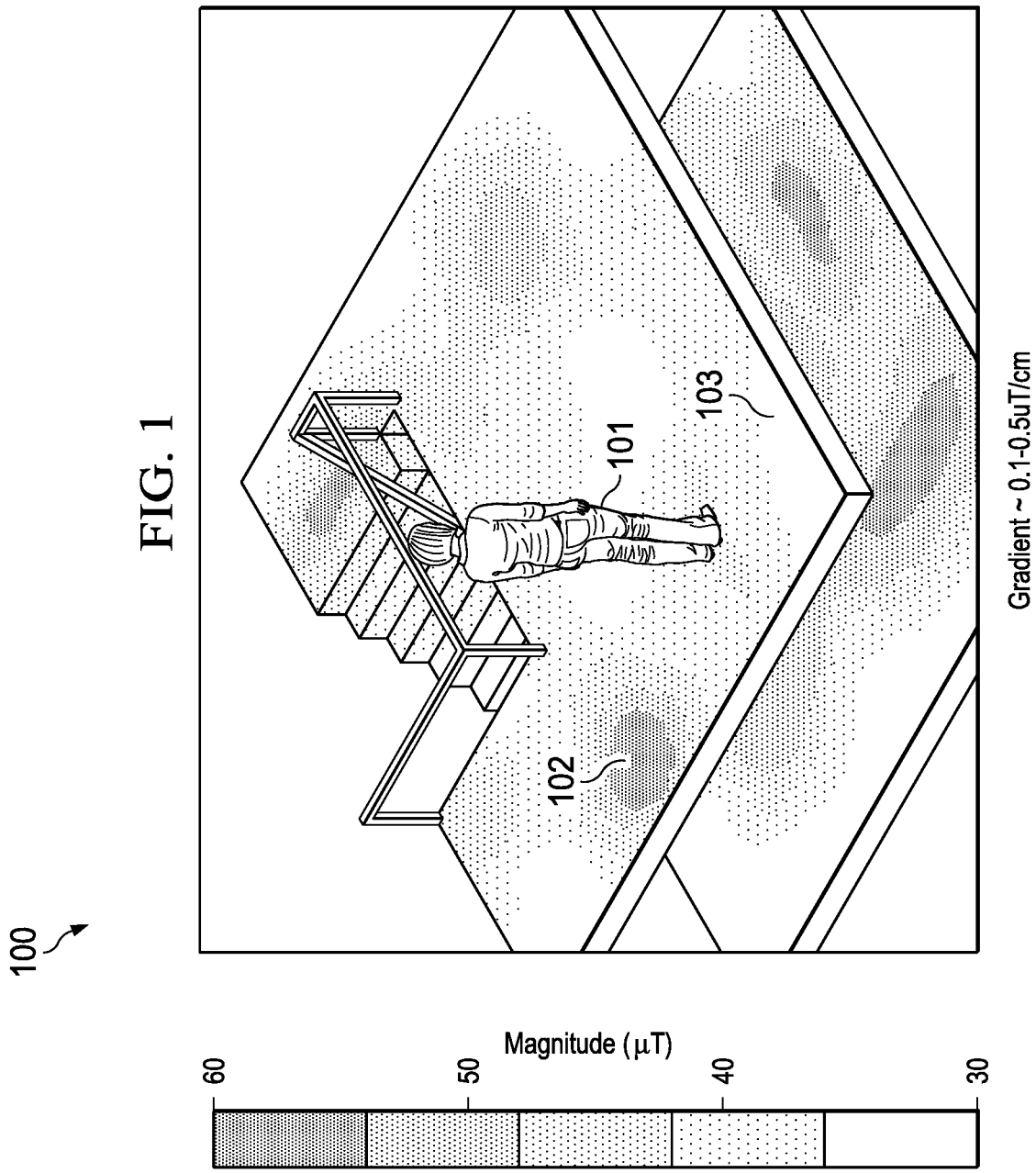
FIG. 1 is a conceptual drawing illustrating a typical ambient magnetic field gradient of an indoor environment, according to an embodiment.

FIG. 1 is a conceptual drawing illustrating a typical, ambient magnetic field gradient of an indoor environment, according to an embodiment. The location of user 101 can be tracked using the ambient magnetic field gradient caused by Earth's magnetic field, which in this example has a range of about $0.1$-$.5\mu T/cm$. As shown by the heat map (indicated by shades of gray where the darker the area the higher the magnetic flux density), the typical indoor environment has a non-uniform magnetic field gradient with "dead zones" that have very low magnetic flux density. For example, area 102 has a higher magnetic flux density than area 103. For larger distances (e.g., 1 centimeter (cm) resolution), the ambient magnetic field gradient may be sufficient to track user 101. For precise, short-range position tracking, such as tracking the hands of user 101, the ambient magnetic field gradient is insufficient. To improve the magnetic field gradient, a magnetic source capable of producing a uniform and stationary magnetic field gradient is introduced into the environment, as described in reference to FIG. 2.

Figure 2:
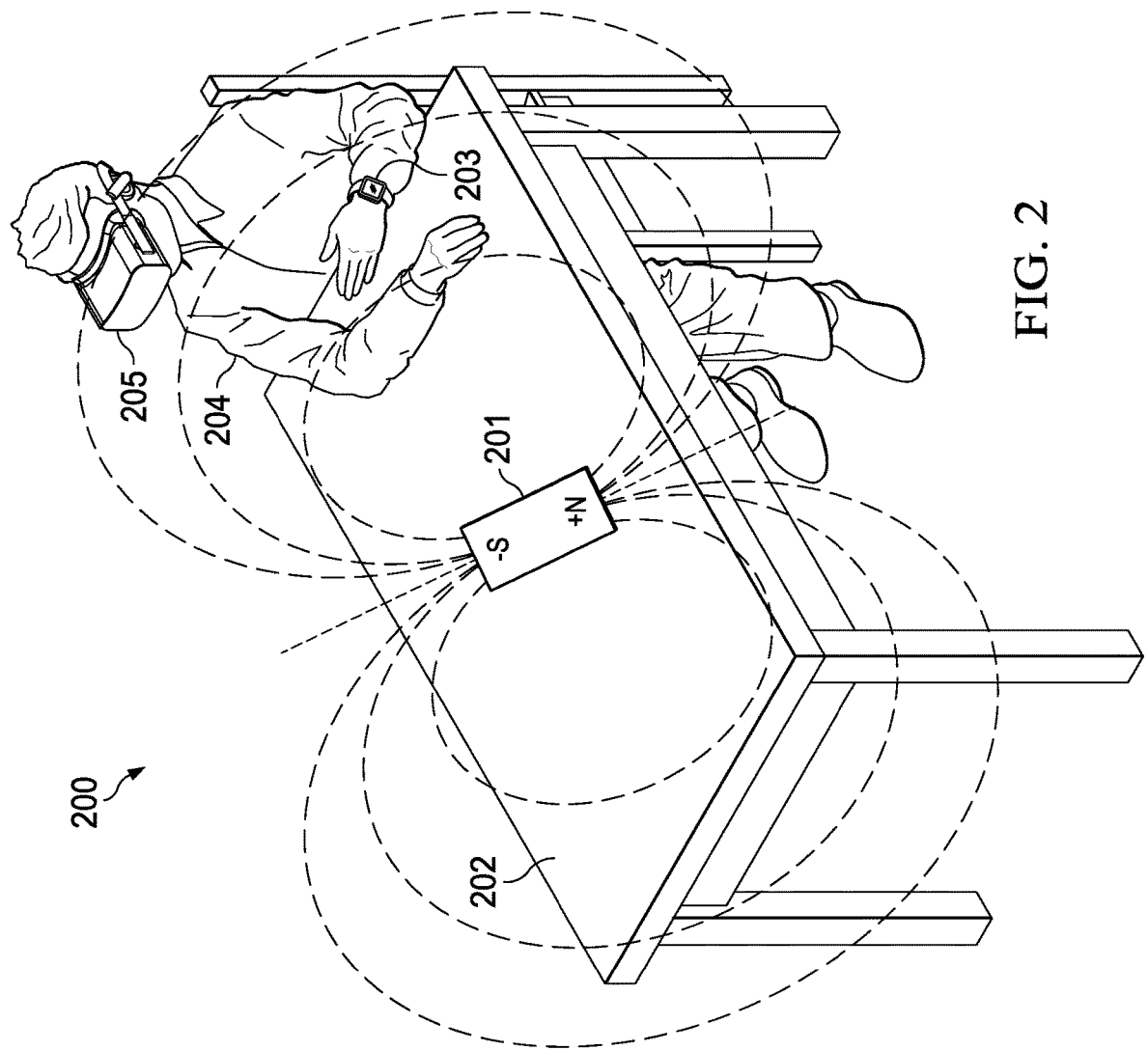
FIG. 2 illustrates the use of a stationary magnetic field gradient generated by a magnetic source to track a user's hands in an AR/VR application, according to an embodiment.

FIG. 2 illustrates the use of a stationary magnetic field gradient generated by a magnetic source (e.g., permanent magnet, electromagnet) to track a user's hands in an AR/VR application, according to an embodiment. Note that reference to an AR/VR application is a non-limiting example of an application that could benefit from the short-range position tracking described herein. Other applications could also benefit from the disclosed embodiments.

In the example shown, magnetic source 201 is placed on table 202 in environment 200 (an indoor or outdoor environment). User 204 is using AR/VR hardware 205 (e.g., VR headset) to interact with a VR application. User 204 is wearing device 203 (e.g., a smartwatch) on his left wrist. The left hand of user 204 moves through the stationary magnetic field gradient generated by magnetic source 201, enabling the sensing array in device 203 to measure the change of the magnetic field gradient as his hand moves. The changing magnetic field gradient is used to compute the velocity of his hand, which is integrated by a processor in device 203 to obtain the position of his hand, as described in reference to FIG. 5.

In an alternative embodiment, magnetic source 201 is mounted on user 204 (e.g., mounted on his head or chest). In the case where magnetic source 201 is mounted on his head the rotation and translation of his head with respect to his hand is removed by the processor to provide a stationary magnetic field gradient with respect to his hand. In an embodiment, device 203 can be worn on both wrists of user 204 and the positions of both devices can be tracked simultaneously.

In an embodiment, the initial position of each hand is established by user 204 by placing his hands at a known reset position (e.g., over the ears). The initial position of the hands can also be determined from data obtained by another sensor. For example, VR hardware 205 can include a camera or ultrasonic distance sensor. In an embodiment, user 204 may have multiple reset positions for his hands, where the positions are reset automatically to known reset locations. In an embodiment, the positions of the hands can be relative to a Cartesian reference coordinate frame fixed to table 202 or to device 203.

In an embodiment, a calibration step can be performed where user 204 moves device 203 within the stationary magnetic field in a variety of predefined translations and orientations so that device 203 can generate and store a reference magnetic field gradient. The reference magnetic field gradient can be used during normal operation to detect if the stationary magnetic field has been disturbed by a ferromagnetic object. If a disturbance is detected, the user can be instructed (through a display or audio of the device or a companion device) to remove the ferromagnetic object from the stationary magnetic field.

Figure 3A:
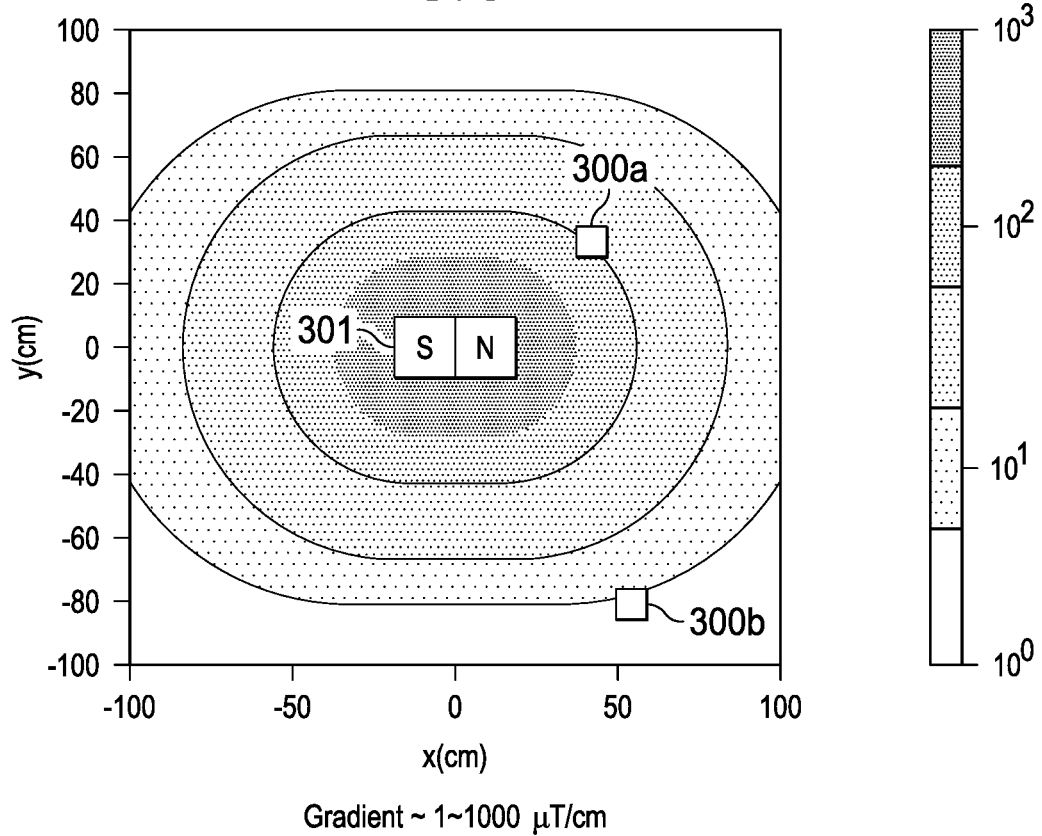
FIG. 3A illustrates a small, stationary permanent magnet field, according to an embodiment.
Figure 3B:
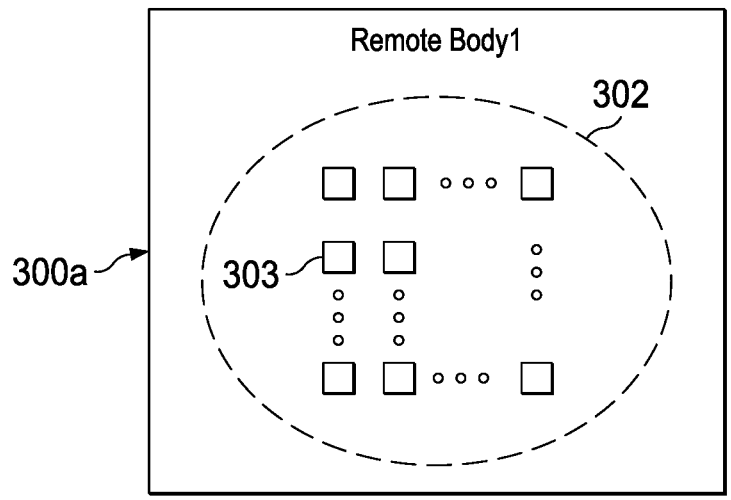
FIG. 3B illustrates a remote body having a sensing array to measure the stationary magnetic field gradient, according to an embodiment

FIG. 3A illustrates a small permanent, stationary magnet field, according to an embodiment. Magnetic source 301 (e.g., a neodymium magnet) generates a stationary magnetic field gradient which has a range of about 1-1000 µT/cm. Remote bodies 300a, 300b are also shown. FIG. 3B illustrates remote body 300a having sensing array 302 with sensors 303 to measure the stationary magnetic field gradient. In an embodiment, interfering magnetic sources are cancelled out by sensing array 302. In an embodiment, sensing array 302 is configured to have a spatial arrangement of sensors 303 (e.g., spatial array of magnetometers) to provide robust gradient measurements, as described in reference to FIGS. 4A and 4B.

Figure 4A:
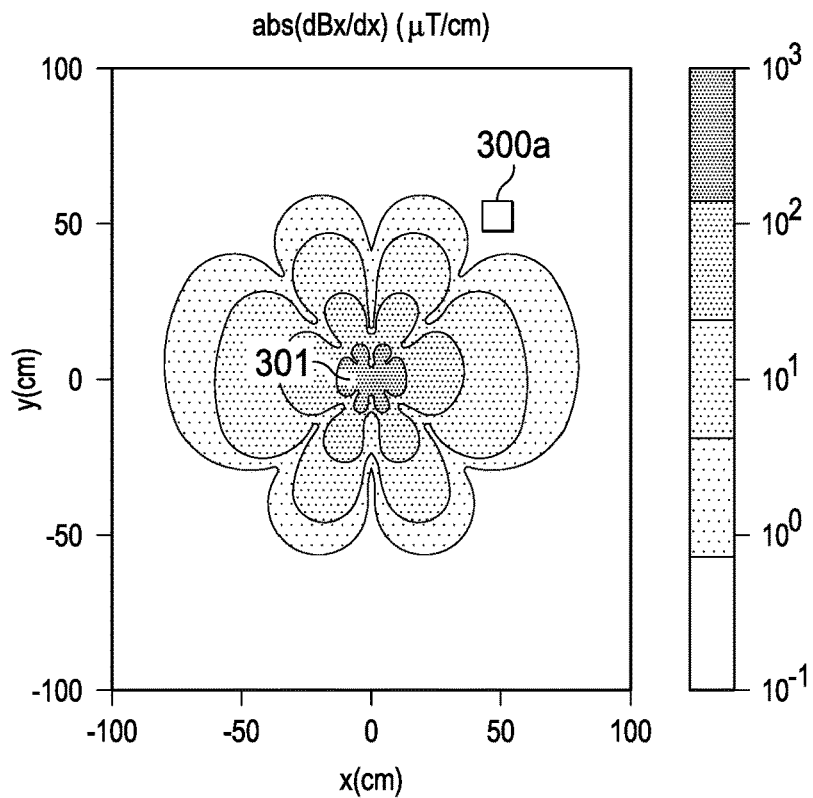
FIGS. 4A and 4B illustrate simulated stationary magnetic field gradients, according to an embodiment.
Figure 4B:
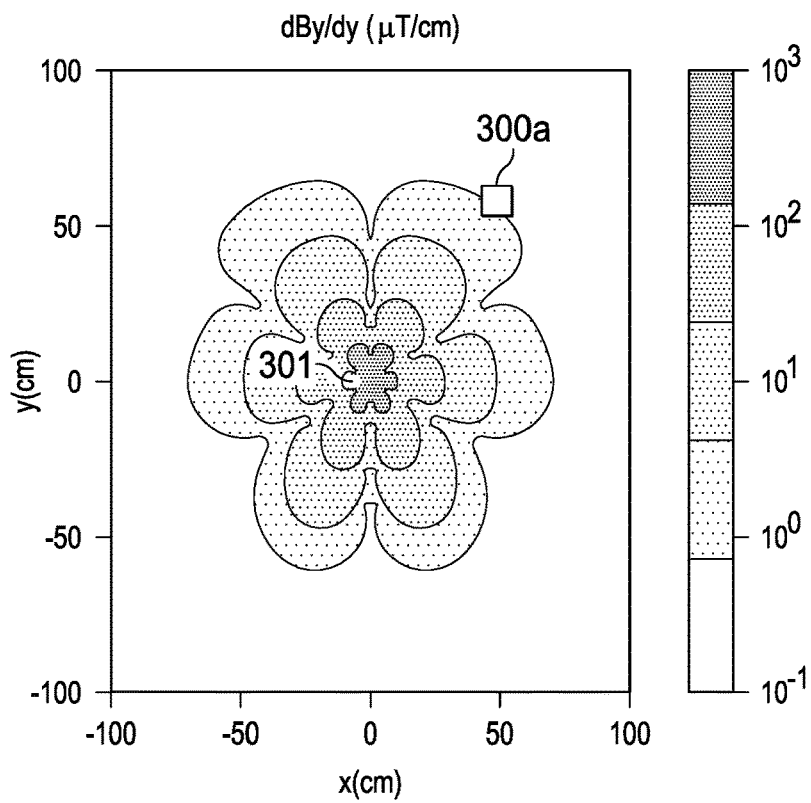

FIGS. 4A and 4B illustrate simulated magnetic field gradients, according to an embodiment. As previously disclosed, a small neodymium magnet can generate a uniform and stationary magnetic field gradient up to 1000 µT/cm in the short range (e.g., within 50 cm). The stationary magnetic field gradient is independent of the ambient magnetic field gradient of the local environment. The magnetic field gradient is strong enough in the short range (e.g., sufficiently high signal-to-noise (SNR)) to be measured by sensing array 302 in remote body 300a.

Figure 5:
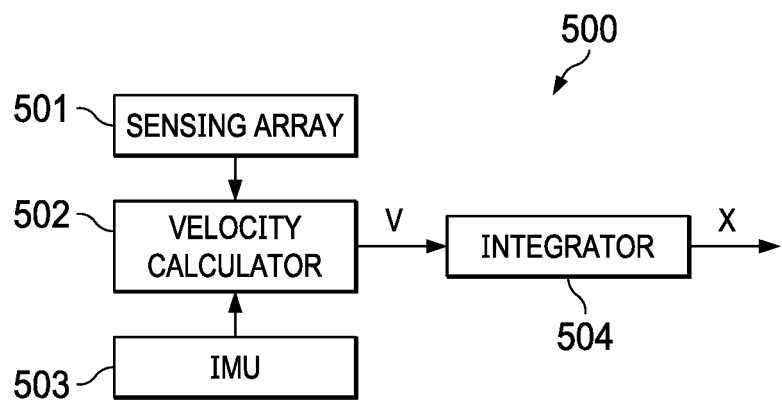
FIG. 5 is a conceptual block diagram of a position estimator, according to an embodiment.

FIG. 5 is a conceptual block diagram of a position estimator 500, according to an embodiment. Position estimator 500 includes sensing array 501, velocity calculator 502, IMU 503 and integrator 504. Sensing array 501 includes a spatial array of magnetometers that measure a change in the magnetic field gradient. In an embodiment, velocity calculator 502 and integrator 504 are implemented in software or firmware executed by one or more processors, such as a central processing unit (CPU), digital signal processor (DSP) or an embedded processor in an application specific integrated circuit (ASIC). In an embodiment, the velocity V of a remote body is derived from Equation [1]:

$$\dot{B} = -\Omega \times B + RV^2 hR^T V, \quad [1]$$

where $\dot{B}$ is the time derivative of the sensed magnetic field B, $\Omega$ is rotation angle vector obtained from IMU 503, R is a rotation matrix from an inertial frame to the remote body frame, $\nabla^2 h$ is unknown and measured by a 3-axis magnetometer and V is the velocity of the remote body. A detailed derivation of Equation [1] is found in Vissière, David, Alain Martin, Nicolas Petit. "Using Distributed Magnetometers to Increase IMU-based Velocity Estimation into Perturbed Area." 2007 46th IEEE Conference on Decision and Control, 2007.

Velocity calculator 502 solves Equation [1] for velocity V and integrator 504 integrates the velocity V to obtain the position X of the remote body. In an embodiment, the rotation angle vector of the remote body $\Omega$ can be determined from a 3-axis MEMs gyro in IMU 503 by, for example, integrating angular rates output by the 3-axis MEMs gyro. In an embodiment, the 3-axis MEMs gyro can be packaged in a SoC with a 3-axis magnetometer, a 3-axis MEMs accelerometer and other supporting circuitry for measuring magnetic fields, accelerations and Earth's gravity.

A simplified version of Equation [1] is shown in Equation [2] where the rotation angle is ignored:

$$\int \frac{\partial B}{\partial t} = \frac{\partial B}{\partial x} X \int \frac{\partial x}{\partial t}. \quad [2]$$

For a magnetometer with 0.1 µT RMS noise, the minimum magnetic field gradient required to achieve 1 mm resolution is 1µT/cm.

The position tracking described above is independent of the local ambient magnetic field gradient, which is advantageous in outdoor environments where the ambient magnetic field gradient is low. The disclosed embodiments also allow for simultaneous tracking of multiple bodies within a certain distance of the magnet. The position of a body is calculated by integrating its velocity rather than performing a double integration of acceleration, which is more sensitive to drift.

Figure 6:
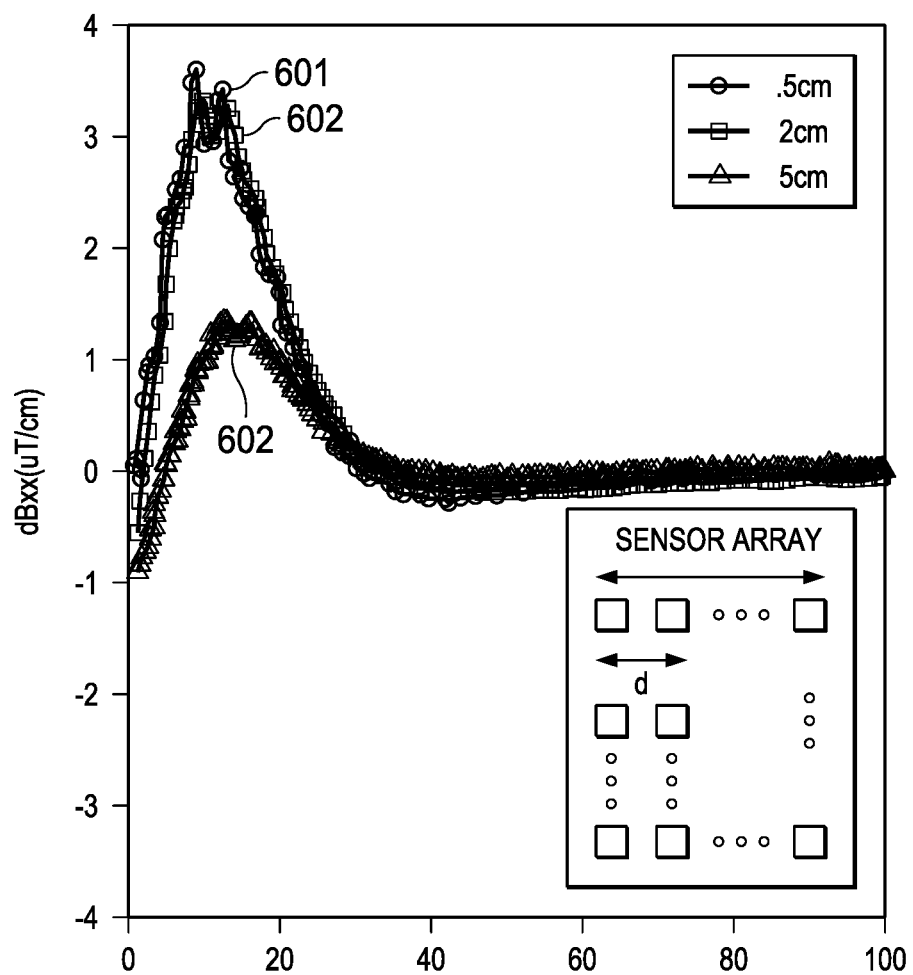
FIG. 6 illustrates a stationary magnetic field gradient measured by a sensing array with different distances between sensors, according to an embodiment.

FIG. 6 illustrates a magnetic field gradient measured by a sensing array with different distances between sensors, according to an embodiment. Plots 601, 602 and 603 show the change in magnetic field gradient for distances 5 cm, 2 cm and 0.5 cm, respectively. To capture accurately the fast decaying gradient from the magnetic source, a magnetometer array is used. When the remote body is close to the magnetic source, two magnetometers in the array that are separated by short distance d are used to measure the magnetic field gradient to avoid underestimating the magnetic field gradient. When the remote body is moving away from the magnetic source, magnetometer pairs separated by a larger distance d are used to measure the magnetic field gradient. The noise in the magnetic field gradient measurement can be simplified according to Equation [3]:

$$\text{Noise} = \frac{.1x\sqrt{2}}{d}, \quad [3]$$

where a larger distance d reduces the noise, resulting in the gradient measurement. This reduction in noise increases the SNR at low magnetic field gradient areas.

Figure 7:
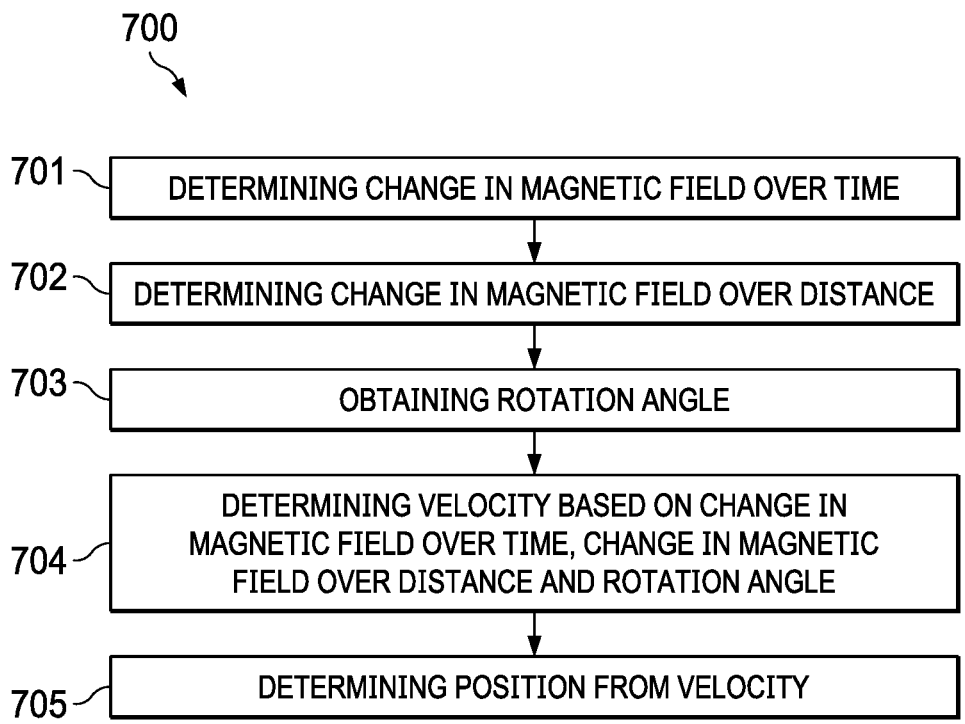
FIG. 7 is a flow diagram of a position tracking process using a stationary magnetic field gradient, according to an embodiment.

FIG. 7 is a flow diagram of a position tracking process 700 using a magnetic field gradient, according to an embodiment. Process 700 can be implemented by the device architecture 800, described in reference to FIG. 8.

In an embodiment, process 700 begins by determining a change in a stationary magnetic field over time (701). For example, a sensor array (e.g., an array of magnetometers) in a device (e.g., smartwatch, smart pencil) worn or held by a user can measure the stationary magnetic field generated by a magnetic source (e.g., permanent magnet, electromagnet) over time.

Process 700 continues by determining a change in the magnetic field over distance (702). For example, the sensor array can measure a change in the magnetic field generated by the magnetic source over distance.

Process 700 continues by obtaining rotation angle of the device (703). For example, a MEMS gyroscope embedded in the device can provide the angular rate of the device, which can be integrated to determine the rotation angle.

Process 700 continues by determining velocity based on the change in the magnetic field over time, the change in magnetic field over distance and the rotation angle (704). For example, one or more processors can determine the velocity of the device using Equation [1].

Process 700 continues by determining the position of the device from the velocity of the device (705). For example, the one or more processors of the device can compute the current position $P_{curr}$ of the device by integrating the velocity V of the device according to Equation [4]:

$$P_{curr} = (V_{curr} - V_{prev}) \times \Delta t + \text{initial position}, \quad [4]$$

where $V_{curr}$ is the current velocity, $V_{prev}$ is previously computed velocity from the previous measurement epoch, and $\Delta t$ is the elapsed time since the previous measurement epoch. $V_{prev}$ is computed during the previous position measurement epoch and stored in a buffer in the device.

Example Device Architecture

Figure 8:
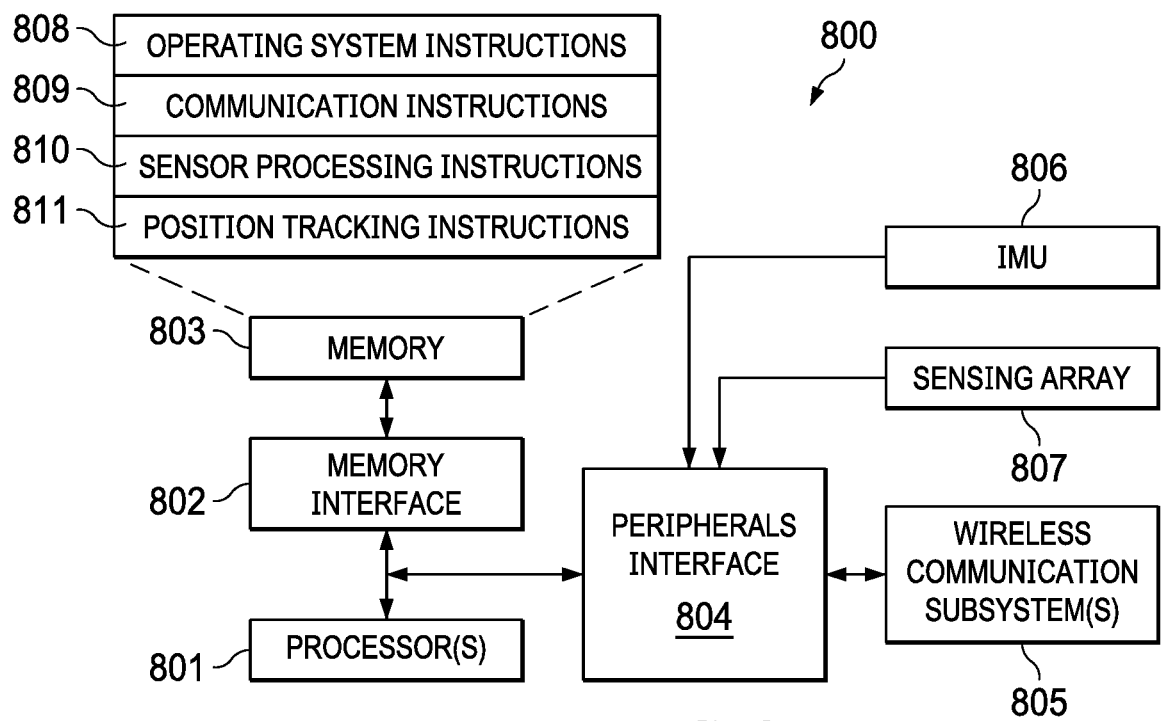
FIG. 8 illustrates a device architecture for implementing the features and processes described in reference to FIGS. 1-7, according to an embodiment The same reference symbol used in various drawings indicates like elements.

FIG. 8 illustrates a device architecture for implementing the features and process described in reference to FIGS. 1-7, according to an embodiment. Architecture 800 can be implemented in any desired system or product, including but not limited to a smartwatch or smart pencil. Architecture 800 can include memory interface 802, one or more data processors, video processors, co-processors, image processors and/or other processors 801, and peripherals interface 804. Memory interface 802, one or more processors 801 and/or peripherals interface 804 can be separate components or can be integrated in one or more integrated circuits. The various components in architecture 800 can be coupled by one or more communication buses or signal lines.

Sensors, devices and subsystems can be coupled to peripherals interface 804 to facilitate multiple functionalities. In this example architecture 800, IMU 806 and sensing array 807 are connected to peripherals interface 804 to provide data that can be used to determine a change in magnetic field gradient as a function of time and distance, as previously described in reference to FIGS. 1-7. IMU 806 can include one or more accelerometers and/or gyros configured to determine change of speed and direction of movement of the device.

Communication functions can be facilitated through one or more wireless communication subsystems 805, which can include radio frequency (RF) receivers and transmitters (or transceivers) and/or optical (e.g., infrared) receivers and transmitters. The specific design and implementation of the communication subsystem 805 can depend on the communication network(s) over which a mobile device is intended to operate. For example, architecture 800 can include communication subsystems 805 designed to operate over a GSM network, a GPRS network, an EDGE network, a Wi-Fi™ or Wi-Max™ network or a Bluetooth™ network.

Memory interface 802 can be coupled to memory 803. Memory 803 can include high-speed random access memory and/or non-volatile memory, such as one or more magnetic disk storage devices, one or more optical storage devices and/or flash memory (e.g., NAND, NOR). Memory 803 can store operating system 808, such as iOS, Darwin, RTXC, LINUX, UNIX, OS X, WINDOWS, or an embedded operating system such as VxWorks. Operating system 808 may include instructions for handling basic system services and for performing hardware dependent tasks. In some implementations, operating system 808 can include a kernel (e.g., UNIX kernel).

Memory 803 stores communication instructions 809 to facilitate communicating with one or more additional devices, one or more computers and/or one or more servers, such as, for example, instructions for implementing a software stack for wired or wireless communications with other devices. Memory 803 stores sensor processing instructions 810 to facilitate sensor-related processing and functions, such as processing output from sensing array 807. Memory 803 stores position tracking instructions 811 for provide the features and performing the processes described in reference to FIGS. 1-7. Memory stores instructions 812 for one or more applications that use the position tracking described in reference to FIGS. 1-7, such as AR or VR applications.

Each of the above identified instructions and applications can correspond to a set of instructions for performing one or more functions described above. These instructions need not be implemented as separate software programs, procedures, or modules. Memory 803 can include additional instructions or fewer instructions. Furthermore, various functions of the mobile device may be implemented in hardware and/or in software, including in one or more signal processing and/or application specific integrated circuits.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., SWIFT, Objective-C, C #, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor or a retina display device for displaying information to the user. The computer can have a touch surface input device (e.g., a touch screen) or a keyboard and a pointing device such as a mouse or a trackball by which the user can provide input to the computer. The computer can have a voice input device for receiving voice commands from the user.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A method comprising:
   determining whether a device operating in an environment is a first threshold distance or a second threshold distance from a magnetic source in the environment, the magnetic source configured to generate a stationary magnetic field in the environment that is independent of ambient magnetic fields in the environment, where the first threshold distance is different than the second threshold distance;
   in accordance with the device being the first threshold distance from the magnetic source, configuring a first set of at least two magnetometers in a sensing array of the device that are separated by a first distance to measure a change in the stationary magnetic field over the first threshold distance;
   in accordance with the device being the second threshold distance from the magnetic source, configuring a second set of at least two magnetometers separated by a second distance to measure the change in the stationary magnetic field over the second threshold distance, where the second distance is greater than the first distance;
   obtaining, by the sensing array of the device, a measurement of the stationary magnetic field in the environment;
   determining, by one or more processors of the device, a first change in the stationary magnetic field over time based on the measurement;
   determining, by the one or more processors, a second change in the stationary magnetic field over the first or second threshold distance based on the measurement;
   obtaining, by the one or more processors, a rotation angle of the device;
   determining, by the one or more processors, a velocity of the device in the environment based on the first change in the magnetic field over time, the second change in the magnetic field over the first or second threshold distance and the rotation angle of the device; and
   integrating, by the one or more processors, the velocity to obtain a position of the device in the environment.

2. The method of claim 1, wherein the sensing array is an array of magnetometers.

3. The method of claim 1, wherein the magnetic source is a permanent magnet or electromagnet.

4. The method of claim 1, wherein the magnetic source is worn or held by a user.

5. The method of claim 4, wherein the magnetic source is mounted on the user's head and the sensing array is mounted to a wrist or hand of the user, and wherein the user's head rotation and translation with respect to the user's wrist or hand is removed by the one or more processors to provide a stationary magnetic field gradient with respect to the sensing array.

6. The method of claim 1, wherein the rotation angle is obtained from angular rate data provided by a gyroscope embedded in the device.

7. The method of claim 1, wherein an initial position of the user's wrist or hand is established based on a predetermined reset position.

8. The method of claim 7, wherein the initial position of the user's wrist or hand is determined from data obtained by a camera or ultrasonic sensor.

9. The method of claim 7, wherein there are multiple reset positions for the user's wrist or hand and the reset positions are reset automatically to predetermined reset locations.

10. An apparatus worn on a wrist of a user or held by the user, comprising:
    a sensing array;
    a motion sensor;
    one or more processors;
    memory coupled to the one or more processors and storing instructions that when executed by the one or more processors, cause the one or more processors to perform operations comprising:
    determining whether a device operating in an environment is a first threshold distance or a second threshold distance from a magnetic source in the environment, the magnetic source configured to generate a stationary magnetic field in the environment that is independent of ambient magnetic fields in the environment, where the first threshold distance is different than the second threshold distance;
    in accordance with the device being the first threshold distance from the magnetic source, configuring a first set of at least two magnetometers in a sensing array of the device that are separated by a first distance to measure a change in the stationary magnetic field over the first threshold distance;
    in accordance with the device being the second threshold distance from the magnetic source, configuring a second set of at least two magnetometers separated by a second distance to measure the change in the stationary magnetic field over the second threshold distance, where the second distance is greater than the first distance;
    obtaining, by the sensing array of the device, a measurement of the stationary magnetic field in the environment;
    determining, by one or more processors of the device, a first change in the stationary magnetic field over time based on the measurement;
    determining, by the one or more processors, a second change in the stationary magnetic field over the first or second threshold distance based on the measurement;
    obtaining, by the one or more processors, a rotation angle of the device;
    determining, by the one or more processors, a velocity of the device in the environment based on the first change in the magnetic field over time, the second change in the magnetic field over the first or second threshold distance and the rotation angle of the device; and integrating, by the one or more processors, the velocity to obtain a position of the device in the environment.

11. The apparatus of claim 10, wherein the motion sensor is a MEMS gyroscope.

12. The apparatus of claim 10, wherein the magnetic source is mounted on a user's head and the sensing array is mounted to a wrist or hand of the user, and wherein the user's head rotation and translation with respect to the user's wrist or hand is removed by the one or more processors to provide a stationary magnetic field gradient with respect to the sensing array user's hand.

13. The apparatus of claim 10, wherein an initial position of the user's wrist or hand is established based on a predetermined reset position.

14. The apparatus of claim 13, wherein the initial position of the wrist or hand of the user is determined from data obtained by a camera or ultrasonic sensor.

15. The apparatus of claim 13, wherein there are multiple reset positions for the user's wrist or hand and the reset positions are reset automatically to predetermined reset locations.

16. A position tracking system, comprising:
a magnetic source in an environment;
a camera or ultrasonic sensor in the environment;
a device configured to be worn on a wrist of a user or held by the user in the environment, the device including:
a sensing array;
a motion sensor;
one or more processors;
memory coupled to the one or more processors and storing instructions that when executed by the one or more processors, cause the one or more processors to perform operations comprising:
determining whether a device operating in an environment is a first threshold distance or a second threshold distance from a magnetic source in the environment, the magnetic source configured to generate a stationary magnetic field in the environment that is independent of ambient magnetic fields in the environment, where the first threshold distance is different than the second threshold distance;
in accordance with the device being the first threshold distance from the magnetic source, configuring a first set of at least two magnetometers in a sensing array of the device that are separated by a first distance to measure a change in the stationary magnetic field over the first threshold distance;
in accordance with the device being the second threshold distance from the magnetic source, configuring a second set of at least two magnetometers separated by a second distance to measure the change in the stationary magnetic field over the second threshold distance, where the second distance is greater than the first distance;
obtaining, by the sensing array of the device, a measurement of the stationary magnetic field in the environment;
determining, by one or more processors of the device, a first change in the stationary magnetic field over time based on the measurement;
determining, by the one or more processors, a second change in the stationary magnetic field over the first or second threshold distance based on the measurement;
obtaining, by the one or more processors, a rotation angle of the device;
determining, by the one or more processors, a velocity of the device in the environment based on the first change in the magnetic field over time, the second change in the magnetic field over the first or second threshold distance and the rotation angle of the device; and
integrating, by the one or more processors, the velocity to obtain a position of the device in the environment.

17. The system of claim 16, wherein the magnetic source is mounted on a user's head and the sensing array is mounted to a wrist or hand of the user, and wherein the user's head rotation and translation with respect to the user's wrist or hand is removed by the one or more processors to provide a stationary magnetic field gradient with respect to the sensing array.

* * * * *